United States Patent [19]

Kasai et al.

[11] Patent Number: 5,070,815
[45] Date of Patent: Dec. 10, 1991

[54] MOCVD DEVICE FOR GROWING A SEMICONDUCTOR LAYER BY THE METAL-ORGANIC CHEMICAL VAPOR DEPOSITION PROCESS

[75] Inventors: Kazumi Kasai, Atsugi; Hiromi Itoh; Hitoshi Tanaka, both of Sagamihara; Nobuaki Tomesakai, Ishehara, all of Japan

[73] Assignee: Fujitsu Limited, Kawasaki, Japan

[21] Appl. No.: 667,891

[22] Filed: Mar. 12, 1991

[30] Foreign Application Priority Data

Mar. 13, 1990 [JP] Japan .................................. 2-61510

[51] Int. Cl.⁵ .............................................. C23C 16/00
[52] U.S. Cl. ..................................... 118/725; 118/730
[58] Field of Search ................................. 118/725, 730

[56] References Cited

U.S. PATENT DOCUMENTS

| | | | |
|---|---|---|---|
| 4,430,959 | 2/1984 | Ebata | 118/725 |
| 4,446,817 | 5/1984 | Crawley | 118/730 |
| 4,794,220 | 12/1988 | Sekiya | 118/730 |

FOREIGN PATENT DOCUMENTS 59-36927 2/1984 Japan .

OTHER PUBLICATIONS

"A New Versatile, Large Size MOVPE Reactor", Frijlink, Journal of Crystal Growth, 93 (1988), pp. 207–215.

*Primary Examiner*—Richard Bueker
*Attorney, Agent, or Firm*—Armstrong, Nikaido, Marmelstein, Kubovcik & Murray

[57] ABSTRACT

A MOCVD apparatus comprises a base, an outer vessel extending upward from the base to form a closed space between the base and the outer vessel, an inner vessel provided in the space such that the inner vessel extends upward from the base in correspondence to the outer vessel to form a closed second space and forming a reaction chamber between the outer vessel and the inner vessel, a gas inlet formed at an upper end of the outer vessel for introducing a source gas into the reaction chamber, a gas outlet formed at the base in correspondence to the reaction chamber for evacuating the reaction chamber, the outer vessel and inner vessel being configured to induce a directional flow of gas in the reaction chamber from the gas inlet to the base, a susceptor provided on the inner vessel to extend generally parallel to the directional flow of the gas for supporting a substrate thereon, a plurality of ring-shaped lamps provided in the second space with a substantially concentric relationship with each other such that each ring defines a major plane that extends parallel to an upper major surface of the base, the plurality of ring-shaped lamps being disposed at respective levels separated from each other when measured from the upper major surface of the base, and a control unit for energizing each of the ring-shaped lamps such that the lamps close to the gas inlet is driven by an electric power that is larger than the lamps heating a middle level par of the substrate.

7 Claims, 4 Drawing Sheets

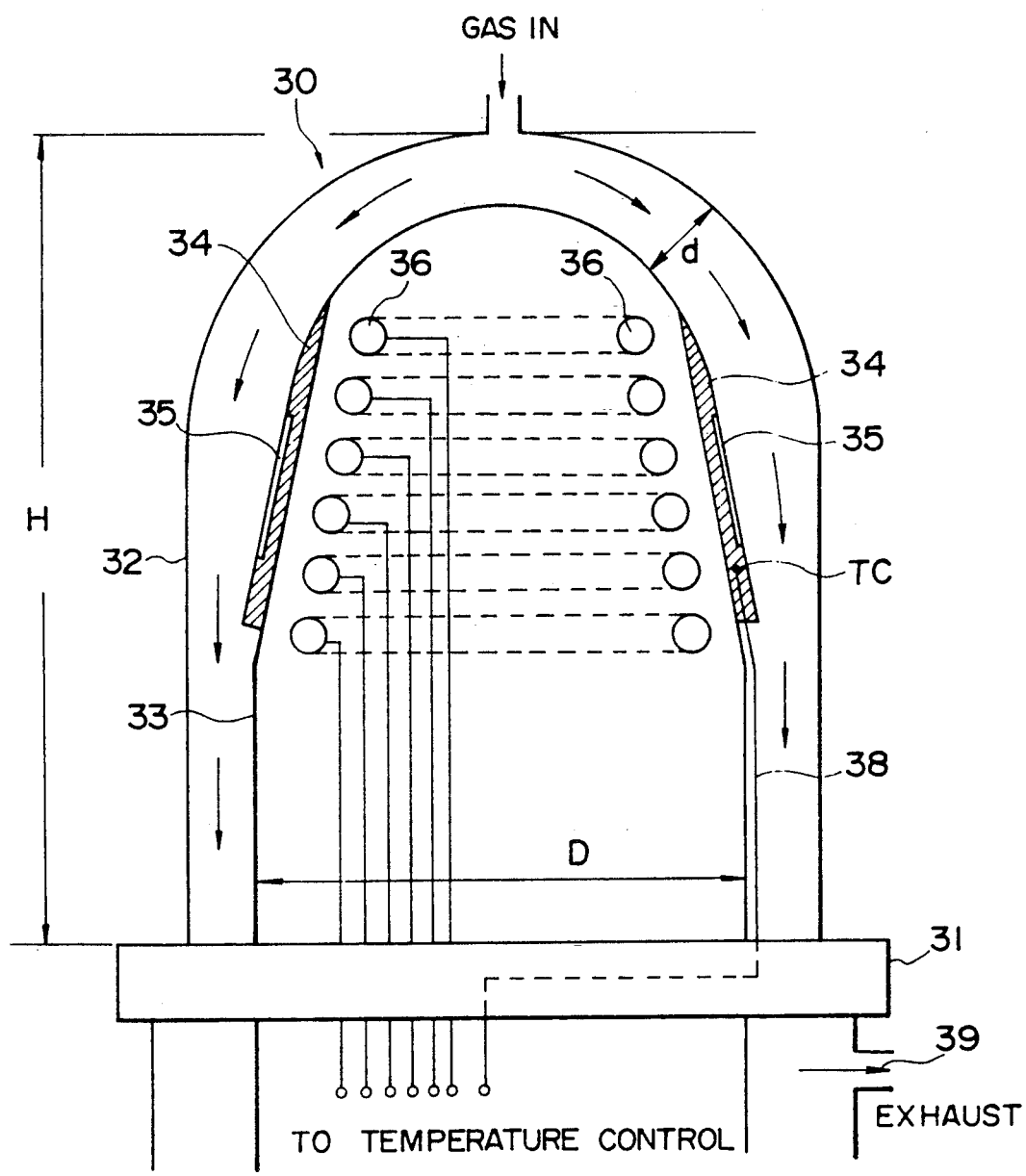

MOCVD DEVICE FOR GROWING A SEMICONDUCTOR LAYER BY THE METAL-ORGANIC CHEMICAL VAPOR DEPOSITION PROCESS

BACKGROUND OF THE INVENTION

The present invention generally relates to the devices for growing semiconductor layers, and in particular to a MOCVD device for growing a semiconductor layer on a substrate by the metal-organic vapor deposition process.

The metal-organic vapor deposition process referred to hereinafter as MOCVD process is one of the major processes for growing compound semiconductor layers having a complex composition on a substrate. Such a process is essential for the fabrication of super-fast semiconductor devices that utilize the group III-V compound semiconductor materials.

In the MOCVD process, the deposition of the semiconductor layer is achieved by the thermal decomposition of an organic or hydride source gas that contains the group III element such as aluminum, gallium, indium and the like, and the group V elements such as arsenic, phosphide and the like. Thereby, the source gas is introduced into a reaction chamber in which a semiconductor substrate is held, and the gas thus introduced is subjected to the thermal decomposition process that may be achieved either by a resistance heating fixture, induction heating fixture, or a radiation heating fixture that uses high-power lamps. As a result of the decomposition, the group III and the group V elements in the gases are released and deposited on the substrate in the form of the desired group III-V compound semiconductor layer.

In such a MOCVD process, the properties of the compound semiconductor layer changes significantly depending on the temperature on the substrate. For example, when a ternary or quarternary compound semiconductor layer is to be grown with the controlled property such as stoichiometry, composition or thickness, it is necessary to maintain the temperature of growth of the semiconductor layer as uniform as possible. Otherwise, the property of the obtained semiconductor layer may change place by place on the surface of the substrate. Even in the case of growing a simple binary compound semiconductor layer such as GaAs, the carrier concentration level of the obtained semiconductor layer may change depending on the place on the substrate surface when the semiconductor layer is doped and there is a temperature inhomogeneity in the growth of the compound semiconductor layer along the surface of the substrate. It should be noted that, even when the dopant elements are introduced with a predetermined concentration, the activation thereof achieved by incorporating the dopants into the predetermined crystallographic sites of the deposited compound semiconductor material, is affected strongly by the temperature in which the growth was made.

In order to control the property of the compound semiconductor layers grown by the MOCVD process, it is necessary to control the temperature of the substrate itself and the gas temperature, rather than the temperature of the susceptor that holds the substrate, as uniform as possible. This means that it is necessary to control the temperature of the gas that makes a contact with the substrate as uniform as possible. It should be noted that when the gas is first introduced into the reaction chamber, the gas generally has a low temperature such as the room temperature and is heated as it flows through the reactor. Thus, the uniform heating of the susceptor or holder of the substrate is not sufficient for obtaining the uniform quality in the grown compound semiconductor layer. In order to achieve the desired uniform quality, the capability of a complex control of the temperature is required for the heating fixture.

The radiation heating fixture utilizing the high-power lamps is advantageous from this view point, as the heating fixture can easily provide a controlled temperature profile by utilizing a number of lamps and controlling each lamp separately. On the other hand, the conventional resistance heating fixture or induction heating fixture lacks the flexibility of adapting to the different temperature profile, gas flow rate, gas composition, and the like.

FIG. 1 shows a prior art MOCVD device that uses a number of lamps for the heating. This device is the one disclosed by Frijlink (Frijlink, P. M., "A New Versatile, Large Size MOVPE Reactor," J. Crystal Growth vol.93, pp.207-215, 1988), which is incorporated herein as reference.

Referring to FIG. 1, the device comprises a reactor 10 having a reaction chamber 10a in which a gas or gas mixture is introduced via a tube 11. The tube 11 has a cone-shaped nozzle 11a for distributing the gas into the reaction chamber 10a, and the reaction chamber 10a has a circular shape in the plan view such that the gas introduced via the nozzle 11a flows along a radial path in the horizontal direction. After the thermal decomposition, the gas is evacuated through exhaust outlets 12 provided at the side wall of the reaction chamber 10a. In the reaction chamber 10a, there is provided a disc-like platform 13 that revolves about an axis substantially coincident to the tube 11, and a number of substrates 14 are provided on the platform 13 such that each substrate 14 revolves about respective rotational axes. In order to cause the thermal decomposition of the gas, a number of bar-shaped tungsten lamps 15 are provided under the platform 13 to extend parallel with each other. It should be noted that the bar-shaped tungsten lamps extend vertically to the sheet of drawing in FIG. 1. In operation, the bar-shaped tungsten lamps 15 are energized independently. Thereby, a uniform temperature distribution is achieved in the reaction chamber.

Such a fixture, however, has a problem in that the temperature profile in the elongating direction of the bar-shaped lamps 15 is not controlled. In other words, the device of FIG. 1 does not provide a uniform temperature distribution in the gas flow in the reaction chamber even when the lamps are controlled individually. Thereby, a complex fixture has to be used for revolving each substrate about their axes while simultaneously revolving the platform 13 about the central axis to homogenize the temperature on the substrate. Further, the MOCVD device of FIG. 1 has a problem in that the size of the device tends to become excessively large because of the use of the disc-shaped platform that requires a lateral placement of the substrate 14 thereon. Such a construction raises a problem particularly when a number of substrates 14 are to be placed on the platform 13 or the size of the substrate 14 is increased. In such a case, it is inevitable to increase the diameter of the platform 13. However, such an increase of platform diameter causes a problem of excessive size of the MOCVD device.

FIG. 2 shows another prior art MOCVD device that uses the lamp heating fixture. The device is the one disclosed in the Japanese Laid-open Patent Application No. 59-36927, which is incorporated herein as reference.

Referring to FIG. 2, the MOCVD device has a bell-jar vessel having a base 21 and an outer, bell-shaped wall 22. Inside the outer wall 22, there is formed a corresponding inner wall 23 with a space defined therebetween, and a number of ring-shaped tungsten lamps 29 are accommodated in the space. It should be noted that each of the ring-shaped lamp 29 defines a plane extending substantially in the horizontal direction. The inner wall 23 defines a reaction chamber 23a in which a gas is introduced via a tube 21 that penetrates through the base 21. The gas thus introduced are evacuated, after the thermal decomposition, via an exhaust outlet tube 25. Further, a rotary shaft 26 extends into the reaction chamber 23a via the base 21 and a disc-shaped platform 27 is provided on the tip end of the shaft 26. Further, a substrate 28 is held on the platform 27 for the growth of the compound semiconductor layer thereon.

In operation, the source gas of reactants is introduced into the reaction chamber via the tube 24 and the tungsten lamps 29 are energized. Thereby, each lamp 29 is controlled such that the output power is large in the lamps located radially outer part while the output power is small in the lamps at the radially inner part in order to compensate the difference in the heat dissipation rate in the substrate. Thereby, a uniform heating of the substrate is achieved.

In this conventional device, however, the control of the gas temperature for realizing the uniform decomposition temperature and hence the uniform crystal growth, is not made. The cold gas introduced in the bell-jar vessel 20 flows along a complex pattern in the reaction chamber 23a and thus, it is extremely difficult to achieve the uniform gas temperature on the surface of the substrate 28 by the control of the tungsten lamps 29. Further, the device of FIG. 2 has a problem similar to the problem of FIG. 1 in that, when a large number of substrates are used for the growth of the compound semiconductor layer or when a large diameter substrate is used, the diameter of the platform 27 is inevitably increased and hence the size of the device.

Thus, a compact MOCVD device that has a capability of controlling the temperature of the source gas flowing through the reaction chamber along the substrate, is desired for the uniform quality of the semiconductor layer.

SUMMARY OF THE INVENTION

Accordingly, it is a general object of the present invention to provide a novel and useful MOCVD device for growing a semiconductor layer on a substrate by the MOCVD process, wherein the foregoing problems are eliminated.

Another and more specific object of the present invention is to provide a MOCVD device for growing a semiconductor layer on a substrate with a uniform property.

Another object of the present invention is to provide a MOCVD device for growing a uniform semiconductor layer on a substrate while flowing a source gas with a precisely controlled temperature profile in a reactor that forms the device.

Another object of the present invention is to provide a compact MOCVD device for growing a uniform semiconductor layer on a substrate while flowing a source gas with a precisely controlled temperature profile in a reactor that forms the device.

Another object of the present invention is to provide a MOCVD device for growing a uniform semiconductor layer on a substrate, comprising a reaction chamber extending in an upward direction, the reaction chamber having an inner wall and an outer, concentric wall and being configured such that the source gas is supplied at a top part thereof and flows in the downward direction passing the surface of the substrate, and a plurality of ring-shaped lamps stacked in the upward direction in correspondence to the substrate along the path of the gas, wherein each ring-shaped lamp is controlled independently. According to the present invention, a desired temperature profile that causes a uniform substrate temperature is formed by controlling each lamp independently. Further, the size of substrate or the number of substrate on which the epitaxial growth of the compound semiconductor device is to be made, can be increased easily by extending the height of the MOCVD device in the upward direction. Thereby, the unwanted increase in the lateral size of the device can be avoided.

Other objects and further features of the present invention will become apparent from the following detailed description when read in conjunction with the attached drawings.

DRAWING DESCRIPTION

FIG. 3(A) is a cross sectional view showing the construction of a MOCVD device according to an embodiment of the present invention;

DETAILED DESCRIPTION

Figure 1:
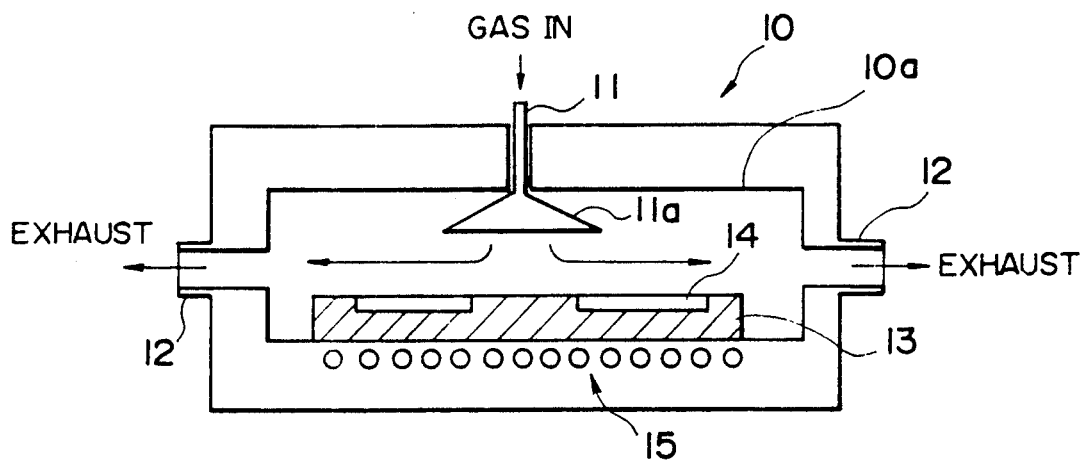
FIG. 1 is a cross sectional view showing the construction of a conventional MOCVD device.
Figure 2:
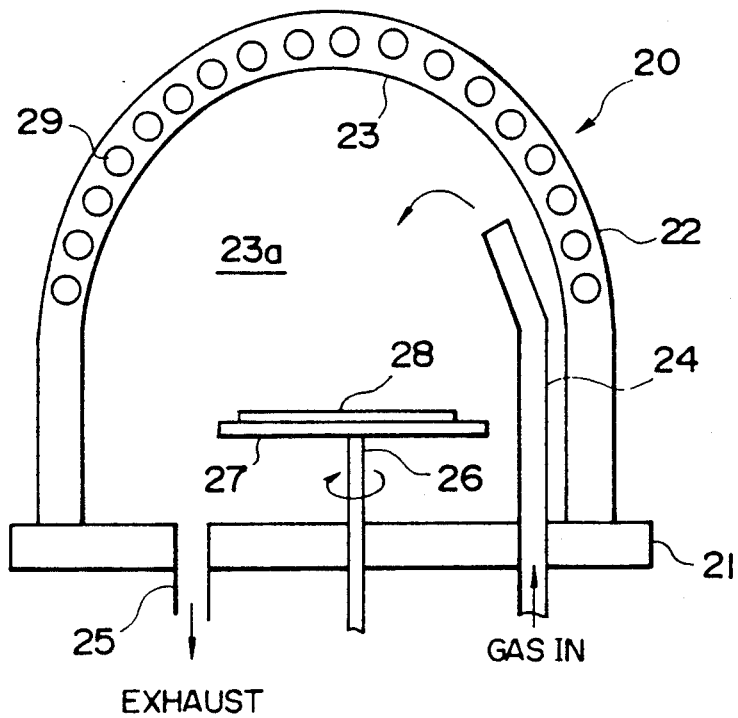
FIG. 2 is a cross sectional view showing another conventional MOCVD device.

FIG. 3 shows an embodiment of the MOCVD device according to the present invention.

Referring to FIG. 3, the MOCVD device, generally designated as a device 30, comprises a base 31 and a bell-jar shaped outer vessel 32 that may be made of quartz or stainless steel. The vessel 32 may have a height H of 50-60 cm and a generally circular cross section in the plan view. Inside the vessel 32, there is provided an inner vessel 33 of quartz that has a bell-jar shape corresponding to the outer vessel 32.

The inner vessel 32 and the outer vessel 31 forms a reaction chamber therebetween, and a source gas is introduced into the reaction chamber at a top part of the outer vessel 31. Thus, the gas introduced in the reaction chamber flows in the downward direction along the side surface of the inner vessel 33, and is evacuated at an exhaust port 39.

On the outer side surface of the inner vessel 33 that faces the reaction chamber, a number of carbon susceptors 34 are provided to circle the vessel 33 in a horizontal plane, and each susceptor 34 holds a substrate 35 on which a semiconductor layer is to be grown by the MOCVD process. It should be noted that the inner vessel 33 has a diameter D that increases gradually from the top to the bottom, wherein the diameter D has a size of about 40-50 cm at the base part of the vessel 33. The substrate 35 typically has a size of 3 inches and provided such that the semiconductor substrate that is held thereon has a top surface substantially parallel to the general direction of flow of the gas in the reaction chamber. In order to prevent formation of vortex in the reaction chamber and to guarantee the stable unidirectional flow of gas from the inlet to the base 31 and further to the exhaust port 39, the separation d between the outer vessel 32 and the inner vessel 33 is preferably set to about 5 cm or less.

Within the space formed inside the inner vessel 33, a number of ring-shaped tungsten lamps 36 are provided such that each lamp is located on a horizontal plane. Further, the lamps are arranged such that one lamp is located above another one, and thereby the lamps are arranged along the susceptor 34. Thus, the lamp at the top part heats the top part of the susceptor 34 while the lamp at the bottom part heats the bottom part of the susceptor 34. Further, each lamp 36 is controlled independently by a temperature controller. In order to monitor the temperature in the susceptor, a thermocouple TC is embedded in the susceptor 34.

Next, an example of the epitaxial growth of a semiconductor layer on the substrate 23 will be described. It should be noted that in the example below, an AlGaAs layer is grown on a GaAs substrate 35 with controlled doping level.

In this example, a carrier gas of hydrogen is supplied to the top part of the outer vessel 32 and caused to flow through the reaction chamber between the outer vessel 32 and the inner vessel 33 in the downward direction with a flow rate of 100 l/min. Further, an arsine gas containing 18% of arsine in hydrogen is supplied with a flow rate of 2 l/min. In addition to arsine, trimethyl gallium and trimethyl aluminum are supplied with the flow rate of 100 cc/min and 30 cc/min, respectively. The temperature for the trimethyl gallium is kept at 0° C. while the temperature for the trimethyl aluminum is kept at 20° C. Further a diluted disilane gas (20 ppm in hydrogen) is introduced as the dopant with the flow rate of 20 cc/min. The temperature of growth was set to 650° C. at the center of the susceptor 34. It should be noted that the susceptor 34 has a size of 25 cm in the gas flow direction and is designed to support the 3 inch substrate.

Each ring-shaped lamp 36 has a 200 volt—12 ampere rating, and eight such lamps are arranged in the vertical direction with a 25 mm interval. The outer diameter of the lamp may be 1-2 cm. In operation, each lamp 36 heats the GaAs substrate 35 on the carbon susceptor 34 under the control of the controller not illustrated, and in response to the heating, the source gas causes the thermal decomposition on the surface of the substrate and the desired deposition of the AlGaAs layer is achieved. It should be noted that the temperature of the substrate 35 is controlled by using the output voltage of the thermocouple TC embedded in the susceptor 34, and a uniform temperature distribution is realized on the surface of the substrate 35 by independently controlling the power of the lamps 36 independently.

Figure 3B:
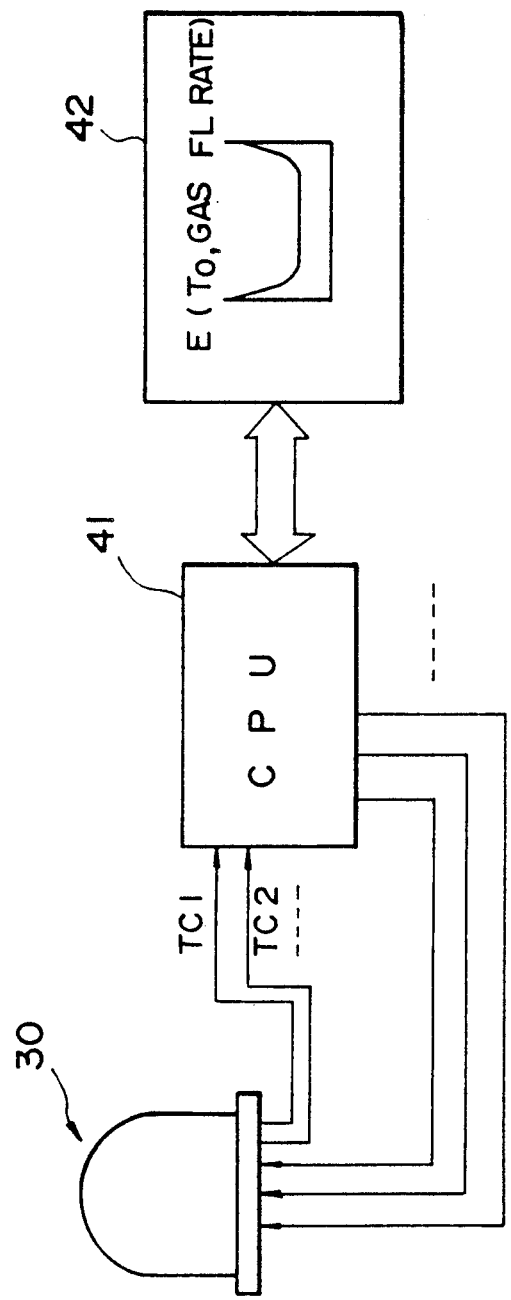
FIG. 3(B) is a block diagram showing the control system of the MOCVD device of FIG. 3(A)

FIG. 3(B) shows the control system of the MOCVD device of FIG. 3(A).

Referring to the FIG. 3(B), output of one or more thermocouples TC1, TC2, . . . embedded in the susceptor 34 similar to the thermocouple TC is supplied to a control unit 41. In response to the thermocouple output, the control unit 41 reads a profile E of lamp energization that is stored in a memory 42 for each set of the desired temperature To and the gas flow rate of each source gas. The energization profile E is determined such that the gas is heated intensively at the upstream side while less intensively in correspondence to the central part of the substrate 356, such that the growth of the epitaxial layer is made on the substrate 35 at a substantially uniform temperature. Of course, such an inhomogeneous heating may cause a non-uniform temperature distribution in the susceptor 34. However, it should be noted that the object of the present invention exists in the point to provide a uniform temperature of epitaxial crystal growth rather that a uniform susceptor temperature profile.

Figure 4A:
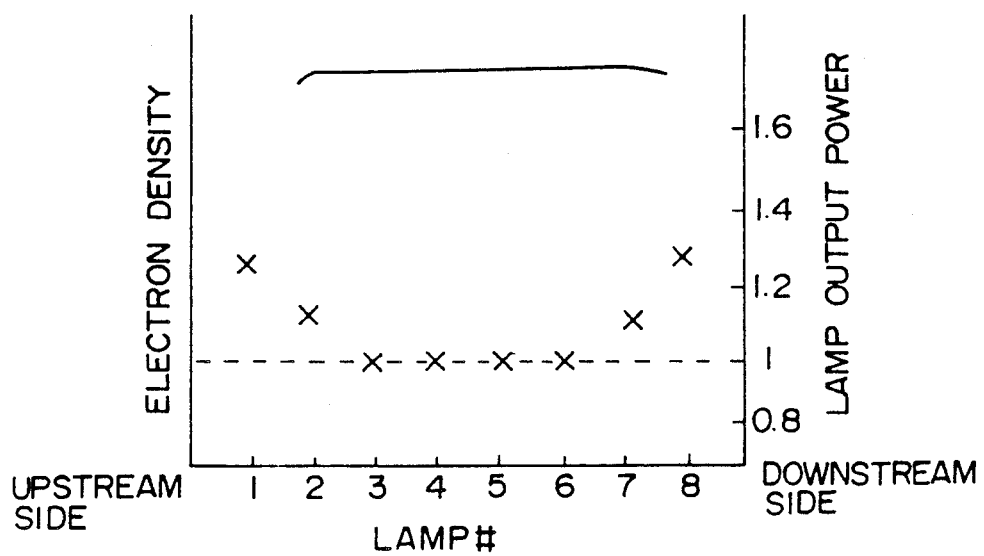
FIGS. 4(A) and 4(B) are graphs showing the temperature profile and the electron concentration level achieved in the semiconductor layer grown by the MOCVD device of the present invention and the conventional MOCVD device.

FIG. 4(A) shows the control of the power of the lamp for achieving a uniform quality of the AlGaAs layer grown on the substrate 35. In this experiment, the quality of the epitaxial layer is evaluated by the electron density that represents the proportion of the activated dopants in the semiconductor layer. Such an activation process is caused by the incorporation of the dopant atoms into the crystallographic sites of the epitaxial layer and is influenced strongly by the temperature. For example, when the growth of the AlGaAs layer is made at a low temperature, relatively small proportion of the dopant atoms are incorporated into the crystallographic sites while the majority of the dopant atoms remain in the interstitial site. Such inactivated dopants cannot release the desired carriers and thus the AlGaAs layer does not show the desired electric property.

Such an insufficient activation of the dopant atoms tends to occur in the upstream side of the substrate 35, as the gas temperature is relatively low in this part of the substrate. The present invention eliminates this problem by controlling the lamp output to be higher than that of the lamps that heat the central part of the substrate 35 as shown in FIG. 4(A). In FIG. 4(A), it should be noted that the vertical axis at the right indicates the output power of the lamps. Further, it was shown that a satisfactory result is obtained when the output power of the lamps at the downstream side is also increased.

FIG. 4(A) also shows the electron density achieved by such an output profile of the lamps. As can be seen, the electron density for the AlGaAs layer thus grown is substantially uniform throughout the entire surface of the substrate. Thereby, the variation of the electron density on the wafer 35 is reduced to less than about ±2%.

Figure 4B:
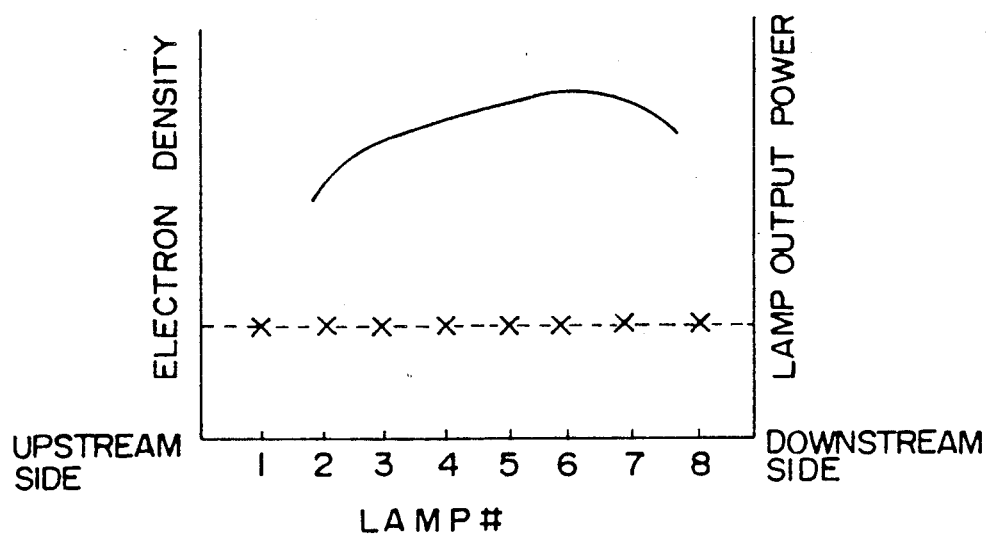

FIG. 4(B), on the other hand, shows the case where the output power of the lamps 36 is controlled uniform throughout. This case corresponds to the conventional MOCVD device that lacks the facility for controlling the lamp output independently. As can be seen in the drawing, the electron density is low in the upstream side and increases gradually toward the downstream side, in correspondence to the increase of the gas temperature. The variation of the electron density can reach as much as ±8%. Thus, such a device can provide only an unsatisfactory result.

Further, the present invention is not limited to the embodiments described heretofore, but various variations and modifications may be made without departing from the scope of the invention.

What is claimed is:

1. An apparatus for growing a semiconductor layer on a substrate, comprising:
   a base having an upper major surface;
   an outer vessel extending upward from the base to form a closed first space between the base and the outer vessel;
   an inner vessel provided in said first space such that the inner vessel extends upward from the base to form a closed second space, said inner vessel having a shape corresponding to the outer vessel and forming a reaction chamber between the outer vessel and the inner vessel;
   a gas inlet formed at an upper end of the outer vessel for introducing a source gas into the reaction chamber;
   a gas outlet formed at the base in correspondence to the reaction chamber for evacuating the reaction chamber;
   said outer vessel and inner vessel being configured to induce a directional flow of gas in the reaction chamber from the gas inlet to the base;
   a susceptor provided on the inner vessel to extend generally parallel to the directional flow of the gas for supporting the substrate thereon such that the substrate has a surface extending generally parallel to the directional flow of the gas;
   a plurality of ring-shaped lamps provided in the second space with a substantially concentric relationship with each other such that each ring defines a major plane that extends parallel to the upper major surface of the base, said plurality of ring-shaped lamps being disposed at respective levels separated from each other when measured from the upper major surface of the base; and
   control means for energizing each of the ring-shaped lamps.

2. An apparatus as claimed in claim 1 in which said plurality of ring-shaped lamps are disposed such that the lamps close to the gas inlet heat the susceptor at an upper level part thereof close to the gas inlet, the lamps close to the gas outlet heat the susceptor at a lower level part thereof close to the gas outlet, while other lamps heat the substrate in correspondence to a middle level part of the susceptor located between the upper level part and the lower level part.

3. An apparatus as claimed in claim 1 in which said control means energizes each of the ring-shaped lamps such that the lamps close to the gas inlet and outlet are driven by an electric power that is larger than the lamps heating a middle level part of the substrate.

4. An apparatus as claimed in claim 1 in which said control means energizes each of the ring-shaped lamps such that the gas introduced into the reaction chamber has a substantially uniform temperature on the surface of the substrate.

5. An apparatus as claimed in claim 1 in which said control means energized each of the ring-shaped lamps such that the lamps close to the base is driven by an electric power that is larger than the lamps heating the middle level part of the substrate.

6. An apparatus as claimed in claim 1 in which said outer vessel and inner vessel are separated from each other to form a separation therebetween, such that the gas flows through the reaction chamber from the gas inlet to the base substantially in the form of unidirectional flow.

7. An apparatus as claimed in claim 1 in which said inner and outer vessels form a pair of concentric circles when sectioned in a hypothetical plane parallel to the upper major surface of the base, each of said concentric circles having a diameter that reduces with an increasing distance from the upper major surface of the base to the hypothetical surface, and said gas introduced into the reaction chamber at the gas inlet spreads in a radial direction as it flows to the base.

* * * * *